(12) United States Patent
Cho et al.

(10) Patent No.: US 10,075,285 B2
(45) Date of Patent: Sep. 11, 2018

(54) LOOP BANDWIDTH ADJUSTING METHOD FOR PHASE LOCKED-LOOP UNIT AND ASSOCIATED LOOP BANDWIDTH ADJUSTING UNIT AND PHASE RECOVERY MODULE

(71) Applicant: MStar Semiconductor, Inc., Hsinchu Hsien (TW)

(72) Inventors: Ting-Nan Cho, Hsinchu Hsien (TW); Kai-Wen Cheng, Hsinchu Hsien (TW); Tai-Lai Tung, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/610,743

(22) Filed: Jun. 1, 2017

(65) Prior Publication Data

US 2018/0159678 A1    Jun. 7, 2018

(30) Foreign Application Priority Data

Dec. 1, 2016 (TW) .............................. 105139602 A (51) Int. Cl.
 *H04L 7/00* (2006.01)
 *H04L 7/033* (2006.01)
(52) U.S. Cl.
 CPC .......... *H04L 7/0331* (2013.01); *H04L 7/0016* (2013.01)
(58) Field of Classification Search
 CPC .......................... H04L 7/0331; H04L 7/0016
 See application file for complete search history.

(56) References Cited

U.S. PATENT DOCUMENTS

| | | | | |
|---|---|---|---|---|
| 5,703,539 A | * | 12/1997 | Gillig | H03L 7/107 331/16 |
| 5,838,202 A | * | 11/1998 | Kosiec | H03L 7/10 327/156 |
| 6,522,206 B1 | * | 2/2003 | Kornblum | H03L 7/0898 331/1 A |
| 7,321,612 B2 | * | 1/2008 | Tonietto | G11B 20/10009 342/151 |
| 7,501,900 B2 | * | 3/2009 | Hull | H03L 7/081 331/1 A |
| 8,773,184 B1 | | 7/2014 | Petrov et al. | |

(Continued)

*Primary Examiner* — Jaison Joseph
(74) *Attorney, Agent, or Firm* — Edell, Shapiro & Finnan, LLC (57) ABSTRACT

A bandwidth adjusting method for a phase-locked loop (PLL) unit of a phase recovery module includes: adjusting an operating bandwidth of the PLL unit to a first bandwidth; measuring multiple first phase errors between a compensated input signal, which is generated according to an input signal and a phase compensating signal that the PLL unit generates, and a reference clock signal, and obtaining a first statistical value of the first phase errors; adjusting the operating bandwidth of the PLL unit to a second bandwidth; measuring multiple second phase differences between the compensated input signal and the reference clock signal, and obtaining a second statistical value of the second phase differences; and adjusting the operating bandwidth according to the first statistical value and the second statistical value. The first bandwidth and the second bandwidth are obtained by interpolating an upper bandwidth limit and a lower bandwidth limit.

11 Claims, 6 Drawing Sheets

(56) References Cited

U.S. PATENT DOCUMENTS

| | | | |
|---|---|---|---|
| 2003/0076175 A1* | 4/2003 | Fischer | H03L 7/093 331/17 |
| 2004/0032842 A1* | 2/2004 | Mesecher | H04B 1/707 370/335 |
| 2014/0029708 A1 | 1/2014 | Hewavithana et al. | |

* cited by examiner

LOOP BANDWIDTH ADJUSTING METHOD FOR PHASE LOCKED-LOOP UNIT AND ASSOCIATED LOOP BANDWIDTH ADJUSTING UNIT AND PHASE RECOVERY MODULE

This application claims the benefit of Taiwan application Serial No. 105139602, filed Dec. 1, 2016, the subject matter of which is incorporated herein by reference.

BACKGROUND OF THE INVENTION

Field of the Invention

The invention relates a loop bandwidth adjusting method for a phase-locked loop (PLL) unit in a phase recovery module and associated loop bandwidth adjusting unit and phase recovery module, and more particularly to a loop bandwidth adjusting method that optimizes a bandwidth of a PLL unit through calculating phase errors in a phase recovery module, and associated loop bandwidth adjusting unit and phase recovery module.

Description of the Related Art

A phase-locked loop (PLL) circuit is used to generate a periodic output signal, which is expected to have a constant phase relationship with a periodic input signal. PLL circuits are extensively applied in various types of circuit systems, for example but not limited to, clock and data recovery circuits, transceivers and frequency synthesizers, in wireless communication systems.

Based characteristics (e.g., the frequency) of an input signal and circuit requirements, a loop bandwidth and a damping factor of the PLL circuit need to be appropriately designed in order to achieve balance between a locking speed and locking accuracy. However, because characteristics of an input signal changes with time due to environment factors (e.g., noises), the performance of the PLL circuit may not persistently maintain a designed optimum value if the loop bandwidth and damping factor of the PLL circuit stay constant. Therefore, there is a need for a solution that adaptively adjusts characteristics of the PLL circuit during operation.

SUMMARY OF THE INVENTION

The invention is directed to a loop bandwidth adjusting method for optimizing a loop bandwidth of a phase-locked loop (PLL) unit in a phase recovery module, and associated loop bandwidth adjusting unit and phase recovery module.

According to an aspect of the present invention, a loop bandwidth adjusting method for a PLL unit in a phase recovery module of a wireless communication system is provided. The loop bandwidth adjusting method includes: adjusting an operating bandwidth of the PLL unit to a first bandwidth; measuring a plurality of first phase errors between a compensated input signal and a reference clock signal, and obtaining a first statistical value of the first phase errors, wherein the compensated input signal is generated according to an input signal and a phase compensating signal that the PLL unit generates; adjusting the operating bandwidth of the PLL unit to a second bandwidth; measuring a plurality of second phase errors between the compensated input signal and the reference clock signal, and obtaining a second statistical value of the second phase errors; and adjusting the operating bandwidth according to the first statistical value and the second statistical value. The first bandwidth and the second bandwidth are obtained by interpolating an upper bandwidth limit and a lower bandwidth limit.

According to another aspect of the present invention, a loop bandwidth adjusting unit for a phase recovery module in a wireless communication system includes: a statistics circuit, recording a plurality of phase errors between an input signal having been compensated by the phase recovery module and a reference clock signal, and calculating a statistical value of the phase errors to generate a statistical indication signal; a control circuit, generating a bandwidth indication signal according to the statistical indication signal; and a converting circuit, generating at least one filter coefficient for controlling an operating bandwidth of a phase-locked loop (PLL) unit in the phase recovery module according to the bandwidth indication signal.

According to another aspect of the present invention, a phase recovery module for a wireless communication system includes: a multiplying unit, multiplying an input signal by a phase compensating signal to generate a compensated input signal; a phase error detecting unit, detecting a phase difference between the compensated input signal and a reference clock signal; a phase-locked loop (PLL) unit, generating the phase compensating signal according to the phase difference; and a loop bandwidth adjusting unit, adjusting an operating bandwidth of the PLL unit to a first bandwidth, obtaining the phase difference as a plurality of first phase errors, obtaining a first statistical value of the first phase errors, adjusting the operating bandwidth of the PLL unit to a second operating bandwidth, obtaining the phase difference as a plurality of second phase errors, obtaining a second statistical value of the second phase errors, and adjusting the operating bandwidth according to the first statistical value and the second statistical value. The first bandwidth and the second bandwidth are obtained by interpolating an upper bandwidth limit and a lower bandwidth limit.

The above and other aspects of the invention will become better understood with regard to the following detailed description of the non-limiting embodiments. The following description is made with reference to the accompanying drawings.

DETAILED DESCRIPTION OF THE INVENTION

Figure 1:
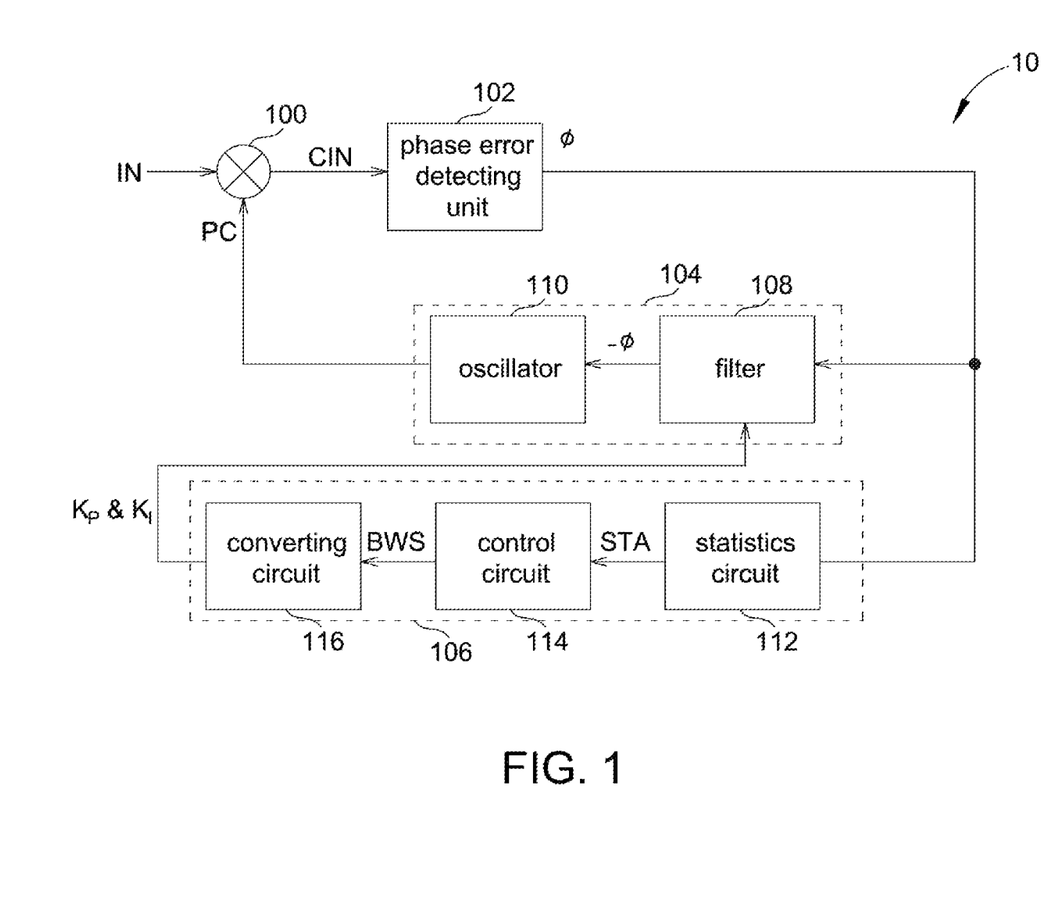
FIG. 1 is a block diagram of a phase recovery module according to an embodiment of the present invention.

FIG. 1 shows a block diagram of a phase recovery module 10 according to an embodiment of the present invention. The phase recovery module 10 is applied in a communication system to compensate a phase error of an input signal IN. As shown in FIG. 1, the phase recovery module 10 includes a multiplying unit 100, a phase error detecting unit 102, a phase-locked loop (PLL) unit 104, and a loop bandwidth adjusting unit 106. The multiplying unit 100 multiplies the input signal IN by a phase compensating signal PC to obtain a compensated input signal CIN. The phase error detecting unit 102 obtains a phase error $\Phi$ between the compensated input signal CIN and a reference clock signal (not shown) of the communication system. The PLL unit 104 includes a filter 108 and an oscillator 110, and adjusts the phase compensating signal PC according to the phase error $\Phi$ to minimize the phase error $\Phi$. In this embodiment, the loop bandwidth adjusting unit 106 calculates a variance of the phase error $\Phi$ of the PLL unit 104 operating in different bandwidths, and accordingly adjusts an operating bandwidth $BW_F$ of the PLL unit 104. In this case, the operating bandwidth $BW_F$ of the PLL unit 104 is adaptively adjusted with the time-variant input signal IN, so as to optimize the performance of the phase recovery module 10.

More specifically, the input signal IN, the phase compensating signal PC and the compensated input signal CIN may be represented by following equations:

$$IN = A \times e^{j\theta_i} \quad (1)$$

$$PC = e^{-j\hat{\theta}_{i-1}} \quad (2)$$

$$CIN = IN \times PC = IN \times e^{-j\hat{\theta}_{i-1}} \quad (3)$$

Known from equations (1) to (3), the phase of the compensated input signal CIN is a sum of the phase of the input signal IN and the phase of the phase compensating signal PC. To allow the communication system to accurately sample the input signal IN, the phase error $\Phi$ between the reference clock signal and the compensated input signal CIN is preferably close to 0. Thus, the filter 108 generates a phase compensation ($-\Phi$) according to the phase error $\Phi$, and the oscillator 110 adjusts the phase compensating signal PC according to the phase compensation ($-\Phi$) that the filter 108 generates to reduce the phase error $\Phi$ between the reference clock signal and the compensated input signal CIN.

Figure 2:
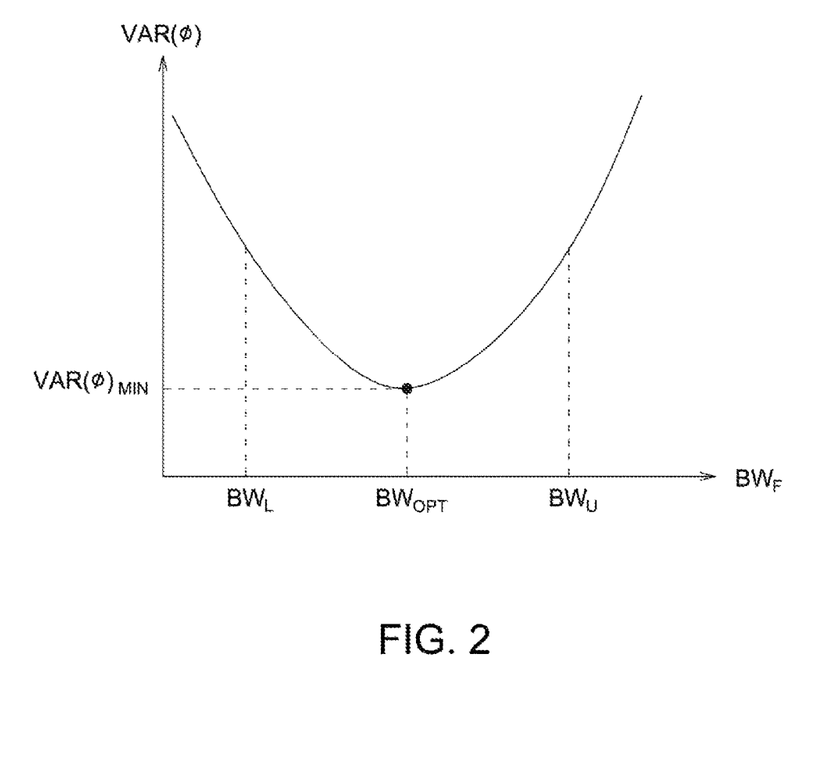
FIG. 2 is a relationship diagram of an operating bandwidth and a phase error according to an embodiment of the present invention.

It should be noted that, the operating bandwidth $BW_F$ of the filter 108 affects the phase error $\Phi$. FIG. 2 shows a relationship diagram of the operating bandwidth $BW_F$ and a phase error variance VAR($\Phi$) according to an embodiment of the present invention. In FIG. 2, the phase error variance VAR($\Phi$) displays a convex function between an upper bandwidth limit $BW_U$ and a lower bandwidth limit $BW_L$. That is to say, the phase error variance VAR($\Phi$) has a minimum phase error variance VAR($\Phi$)$_{MIN}$ between the upper bandwidth limit $BW_U$ and the lower bandwidth limit $BW_L$. If the operating bandwidth $BW_F$ of the filter 108 is adjusted to an optimum bandwidth $BW_{OPT}$ corresponding to the minimum phase error variance VAR($\Phi$)$_{MIN}$, the phase recovery module 10 may obtain the optimum phase error $\Phi$. Thus, according to an embodiment of the present invention, the loop bandwidth adjusting unit 106 records the phase error variance VAR($\Phi$) of the phase recovery module 10 operating in different operating frequencies $BW_F$, so as to adjust the operating bandwidth $BW_F$ of the filter 108 to the optimum bandwidth $BW_{OPT}$ corresponding to the minimum phase error variance VAR($\Phi$)$_{MIN}$ accordingly. As such, the operating frequency $BW_F$ of the filter 108 changes with the time-variant input signal to enhance the performance of the phase recovery module 10.

Operation details of how the loop bandwidth adjusting unit 106 adjusts the operating bandwidth $BW_F$ of the filter 108 to the optimum bandwidth $BW_{OPT}$ corresponding to the minimum phase error variance VAR($\Phi$)$_{MIN}$ are described with an example below. When the phase recovery module 10 starts operating, a control circuit 114 in the loop bandwidth adjusting unit 106 adjusts a bandwidth indication signal BWS to indicate a bandwidth $BW_1$. The bandwidth $BW_1$ is between the upper bandwidth limit $BW_U$ and the lower bandwidth limit $BW_L$, and is obtained by interpolating the upper bandwidth limit $BW_U$ and the lower bandwidth limit $BW_L$. In one embodiment, the bandwidth $BW_1$ may be represented as:

$$BW_1 = BW_L + C \times (BW_U - BW_L) \quad (4)$$

In equation (4), C is a constant between 1 and 0. In one embodiment, the constant is equal to 0.61803, for example. According to the bandwidth indication signal BWS that indicates the bandwidth $BW_1$, the converting circuit 116 generates filter coefficients $K_P$ and $K_I$ corresponding to the bandwidth $BW_1$ to the filter 108 to adjust the bandwidth of the filter 108 to the bandwidth $BW_1$. The filter coefficients $K_P$ and $K_I$ are directly proportional to the bandwidth $BW_1$. In one embodiment, the filter coefficient $K_P$ is directly proportional to the bandwidth $BW_1$ raised to the power of one, and filter coefficient $K_I$ is directly proportional to the bandwidth $BW_1$ raised to the power of two. While the bandwidth of the filter 108 is the bandwidth $BW_1$, the communication system starts to receive the input signal IN, and the multiplying unit 100 adjusts the phase of the input signal IN using the phase compensating signal PC to generate the compensated input signal CIN. The filter 108 generates the phase compensating signal ($-\Phi$) according to a phase error $\Phi$ obtained by the phase error detecting unit 102 to cause the oscillator 110 to adjust the phase compensating signal PC. At this point, the statistics circuit 112 records the phase error $\Phi$ as a phase error $\Phi_1$ corresponding to the bandwidth $BW_1$. For example, the statistics circuit 112 records the phase error $\Phi$ as $\Phi_1$ each time the communication system samples the input data IN. After obtaining a predetermined number of phase errors $\Phi_1$ (e.g., 10,000 phase errors $\Phi_1$), the statistics circuit 112 calculates a variance $VAR_1$ of the recorded phase errors $\Phi_1$, and transmits the variance $VAR_1$ to the control circuit 114 through the statistical indication signal STA.

Next, the control circuit 114 adjusts the bandwidth indication signal BWS to indicate another bandwidth $BW_2$. Similarly, the bandwidth $BW_2$ is between the upper bandwidth limit $BW_U$ and the lower bandwidth limit $BW_L$, and is obtained by interpolating the upper bandwidth limit $BW_U$ and the lower bandwidth limit $BW_L$. In one embodiment, the bandwidth $BW_2$ may be represented as:

$$BW_2 = BW_U - C \times (BW_U - BW_L) \quad (5)$$

In this embodiment, the constant C is equal to 0.61803, and so the bandwidth $BW_2$ is smaller than the bandwidth $BW_1$. According to the bandwidth indication signal BWS that indicates the bandwidth $BW_2$, the converting circuit 116 generates the filter coefficients $K_P$ and $K_I$ corresponding to the bandwidth $BW_2$ to the filter 108 to adjust the bandwidth of the filter 108 to the bandwidth $BW_2$. While the bandwidth of the filter 108 is changed to the bandwidth $BW_2$, the communication system continues receiving the input signal IN, and the oscillator 110 continues adjusting the phase compensating signal PC according to the phase error ($-\Phi$) that the filter 108 generates. At this point, the statistics circuit 112 records the phase error $\Phi$ as a phase error $\Phi_2$ corresponding to the bandwidth $BW_2$ when the bandwidth of the filter 108 is the bandwidth $BW_2$. After obtaining a predetermined number of phase errors $\Phi_2$ (e.g., 10,000 phase errors $\Phi_2$), the statistics circuit 112 calculates a variance $VAR_2$ of the recorded phase errors $\Phi_2$, and transmits the variance $VAR_2$ to the control circuit 114 through the statistical indication signal STA.

After the variances $VAR_1$ and $VAR_2$ are obtained, the control circuit 114 adjusts the bandwidth indication signal BWS according to the relationship between values of the variances $VAR_1$ and $VAR_2$ to optimize the operating bandwidth $BW_F$ of the filter 108. When the variance $VAR_1$ is smaller than the variance $VAR_2$, the control circuit 114 uses the bandwidth $BW_2$ as the new lower bandwidth limit $BW_L$, and sets the bandwidth $BW_2$ to the bandwidth $BW_1$ and the variance $VAR_2$ to the variance $VAR_1$ (i.e., $BW_L=BW_2$, $BW_2=BW_1$, and $VAR_2=VAR_1$). The control circuit 114 then calculates the new bandwidth $BW_1$ according to the new lower bandwidth limit $BW_L$ and the upper bandwidth $BW_U$, and obtains the variance $VAR_1$ corresponding to the new bandwidth $BW_1$ to compare with the variance $VAR_2$.

When the variance $VAR_2$ is smaller than the variance $VAR_1$, the control circuit 114 uses the bandwidth $BW_1$ as the new upper bandwidth limit $BW_U$, and sets the bandwidth $BW_1$ to the bandwidth $BW_2$ and the variance $VAR_1$ to the variance $VAR_2$ (i.e., $BW_U=BW_1$, $BW_1=BW_2$, and $VAR_1=VAR_2$). The control circuit 114 then calculates the new bandwidth $BW_2$ according to the new upper bandwidth limit $BW_U$ and the lower bandwidth $BW_L$, and obtains the variance $VAR_2$ corresponding to the new bandwidth $BW_2$ to compare with the variance $VAR_1$.

By adjusting the bandwidth indication signal BWS through repeatedly comparing the relationship between values of the variances $VAR_1$ and $VAR_2$, the loop bandwidth adjusting unit 106 can adaptively adjust the operating bandwidth $BW_F$ of the filter 108. When a difference between the upper bandwidth limit and the lower bandwidth limit for generating the bandwidths $BW_1$ and $BW_2$ is smaller than a threshold, the loop bandwidth adjusting unit 106 determines that the current upper bandwidth limit and lower bandwidth limit approximate the optimum bandwidth $BW_{OPT}$, and obtains one of the upper bandwidth limit and the lower bandwidth limit as the operating bandwidth $BW_F$ of the filter 108. Thus, the operating bandwidth $BW_F$ of the filter 108 is optimized, such that the performance of the phase recovery module 10 is enhanced.

Based on different applications and design concepts, the loop bandwidth adjusting unit 106 may obtain the optimum bandwidth $BW_{OPT}$ corresponding to the minimum phase error variance $VAR(\Phi)_{MIN}$ by other methods, and the statistics circuit 112, the control circuit 114 and the converting circuit 116 may be implemented by various approaches. For example, instead of using the variance of the phase error $\Phi$, the loop bandwidth adjusting unit 106 may use other statistical values of the phase error $\Phi$ as the basis for determining the optimum bandwidth $BW_{OPT}$.

Figure 3:
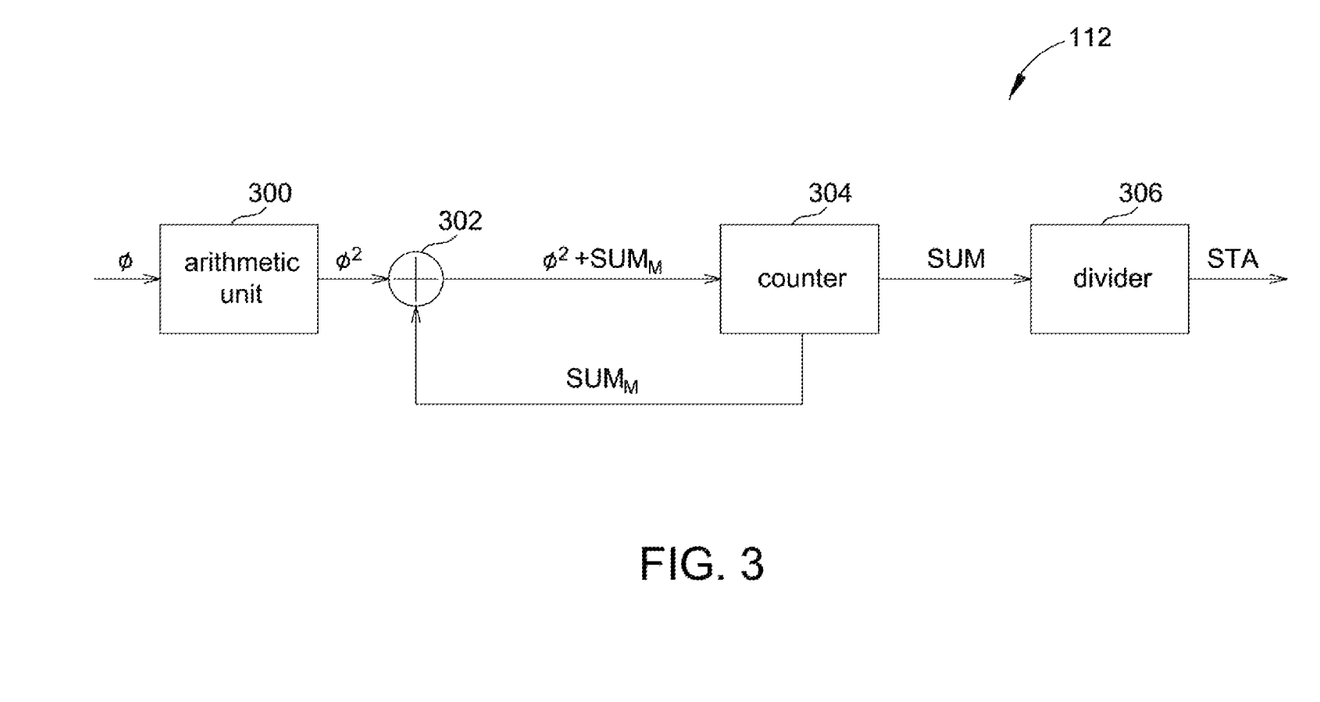
FIG. 3 is a block diagram of a statistics circuit in FIG. 1 according to an embodiment of the present invention.

FIG. 3 shows a block diagram of the statistics circuit 112 in FIG. 1 according to an embodiment of the present invention. In FIG. 3, the statistics circuit 112 includes an arithmetic unit 300, an adder 302, a counter 304 and a divider 306. The arithmetic unit 300 records the phase error $\Phi$ and outputs a square of the phase error $\Phi$ (i.e., $\Phi^2$) to the adder 302. The adder 302 adds $\Phi^2$ to an intermediate total sum $SUM_M$ to generate a sum, and outputs the sum to the counter 304. The counter 304 counts the number of times of receiving the sum of $\Phi^2$ and the intermediate sum $SUM_M$. When the number of times of receiving the sum of $\Phi^2$ and the intermediate sum $SUM_M$ is smaller than a predetermined count (e.g., 10000), the counter 304 uses the sum of $\Phi^2$ and the intermediate sum $SUM_M$ as a new intermediate sum $SUM_M$, and outputs the new intermediate sum $SUM_M$ to the adder 302. When the number of times of receiving the sum of $\Phi^2$ and the intermediate sum $SUM_M$ reaches the predetermined count, the counter 304 outputs the sum of $\Phi^2$ and the intermediate sum $SUM_M$ as a total SUM to output to the divider 306. After receiving the total SUM, the divider 306 divides the total SUM by the predetermined count to obtain the variance of a predetermined number of phase errors $\Phi$, and transmits the variance to the control circuit 114 through the statistical indication signal STA.

In one embodiment, a delay circuit may be added between the adder 302 and the counter 304 to ensure normal operations of the adder 302 and the counter 304.

Figure 4:
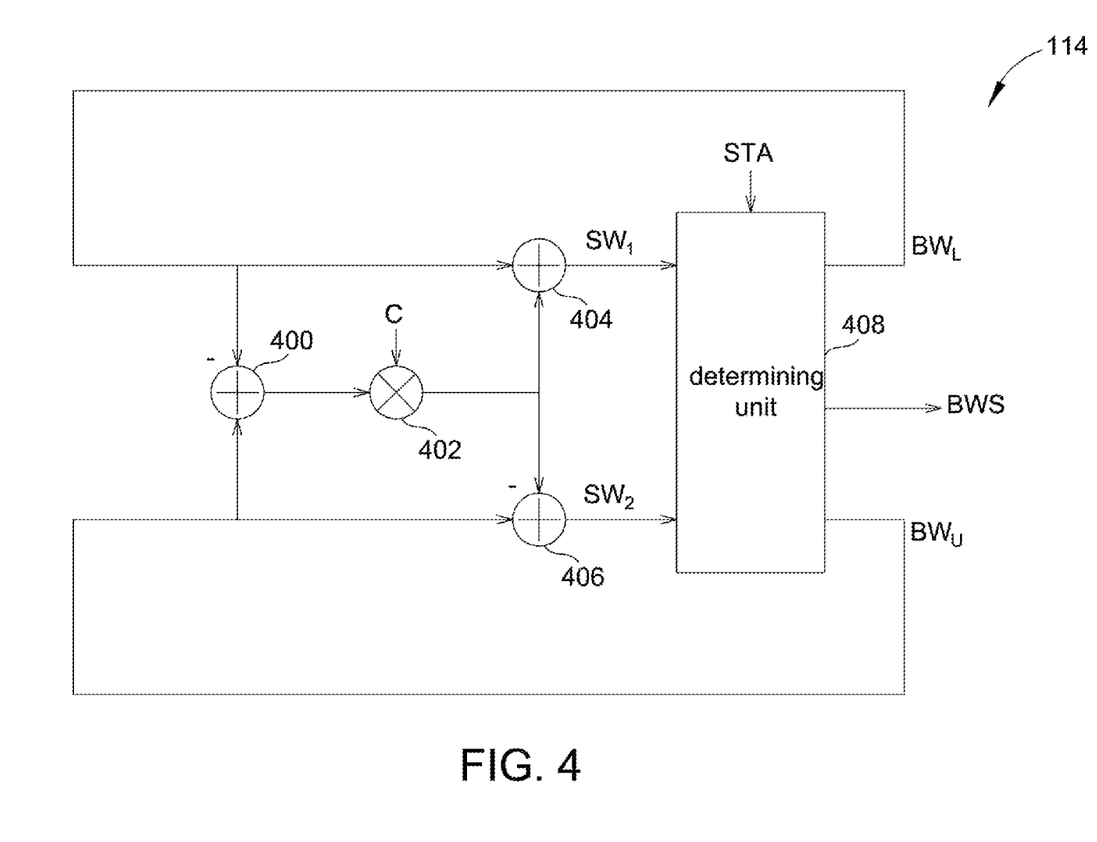
FIG. 4 is a block diagram of a control circuit in FIG. 1 according to an embodiment of the present invention.

FIG. 4 shows a block diagram of the control circuit 114 in FIG. 1 according to an embodiment of the present invention. As shown in FIG. 4, the control circuit 114 includes adders 400, 404 and 406, a multiplier 402 and a determining unit 408. The adder 400 calculates the difference between the upper bandwidth limit $BW_U$ and the lower bandwidth limit $BW_L$, and outputs the difference to the multiplier 402. The multiplier 402 multiplies the difference by the constant C to generate a product to output to the adders 404 and 406. The adder 404 adds the lower bandwidth limit $BW_L$ and the product to generate the bandwidth $BW_1$, and the adder 406 subtracts the product from the upper bandwidth limit $BW_U$ to generate the bandwidth $BW_2$. According to the statistical indication signal STA, the determining unit 408 adaptively adjusts the upper bandwidth limit $BW_U$, the lower bandwidth limit $BW_L$ and the bandwidth indication signal BWS. When the statistical indication signal STA does not indicate the variance $VAR_1$ of the bandwidth $BW_1$ and the variance $VAR_2$ of the bandwidth $BW_2$, the determining unit 408 adjusts the bandwidth indication signal BWS to indicate the bandwidths $BW_1$ and $BW_2$, so as to respectively obtain the variances $VAR_1$ and $VAR_2$. According to the relationship between the values of the variances $VAR_1$ and $VAR_2$ obtained, the determining unit 408 adjusts the upper bandwidth limit $BW_U$, the lower bandwidth limit $BW_L$ and the bandwidth indication signal BWS to optimize the operating bandwidth $BW_F$ of the filter 108. When the variance $VAR_1$ is smaller than the variance $VAR_2$, the determining unit 408 adjust the lower bandwidth limit $BW_L$ to the bandwidth $BW_2$, and adjusts the bandwidth indication signal BWS to indicate the bandwidth $BW_2$. When the variance $VAR_1$ is greater than the variance $VAR_2$, the determining unit 408 adjust the upper bandwidth limit $BW_U$ to the bandwidth $BW_1$, and adjusts the bandwidth indication signal BWS to indicate the bandwidth $BW_1$.

Figure 5:
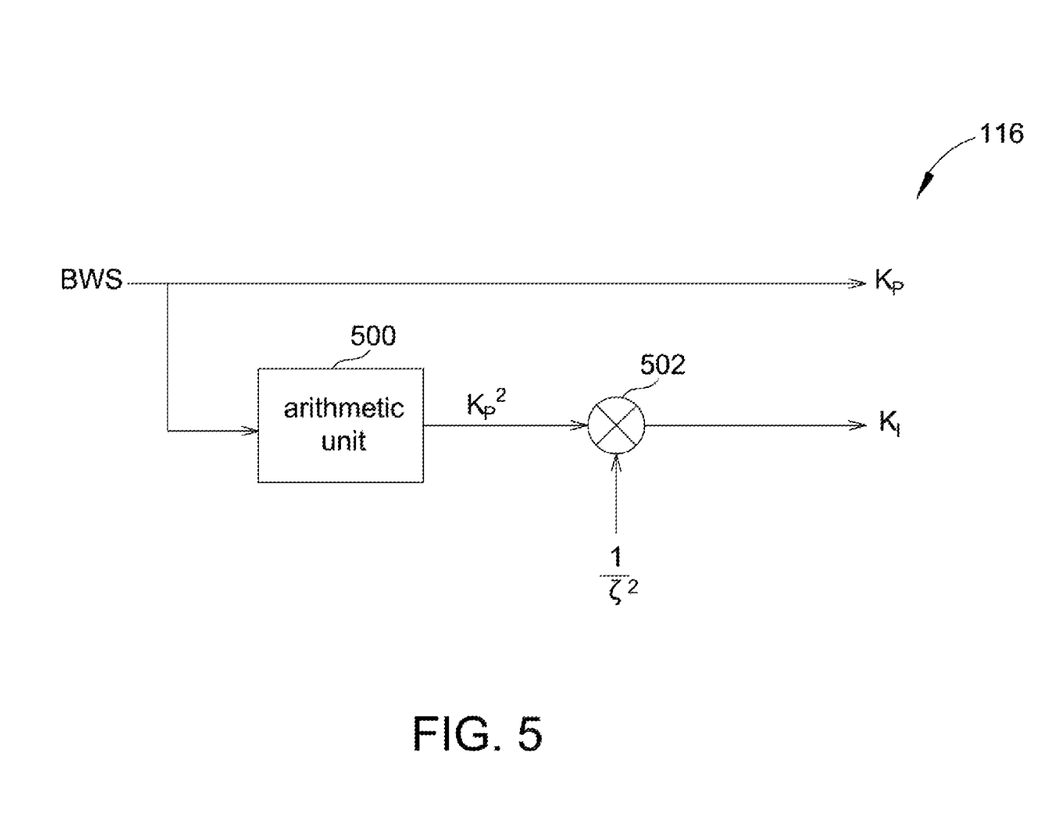
FIG. 5 is a block diagram of a converting circuit in FIG. 1 according to an embodiment of the present invention.

FIG. 5 shows a block diagram of the converting circuit 116 in FIG. 1 according to an embodiment of the present invention. In FIG. 5, the converting circuit 116 includes an arithmetic unit 500 and a multiplier 502. The converting circuit 116 in FIG. 5 directly uses the bandwidth indication signal BWS as the filter coefficient $K_P$ (i.e., the filter coefficient $K_P$ is equal to the bandwidth indicated by the bandwidth indication signal BWS), and after using the arithmetic unit 500 to calculate a square of the bandwidth the bandwidth indication signal BWS indicates, uses the multiplier 502 to calculate a product of the square and a reciprocal of a square of a damping factor $\zeta$ as the filter coefficient $K_I$. Based on different applications and design concepts, the damping factor $\zeta$ may be any predetermined constant.

Figure 6:
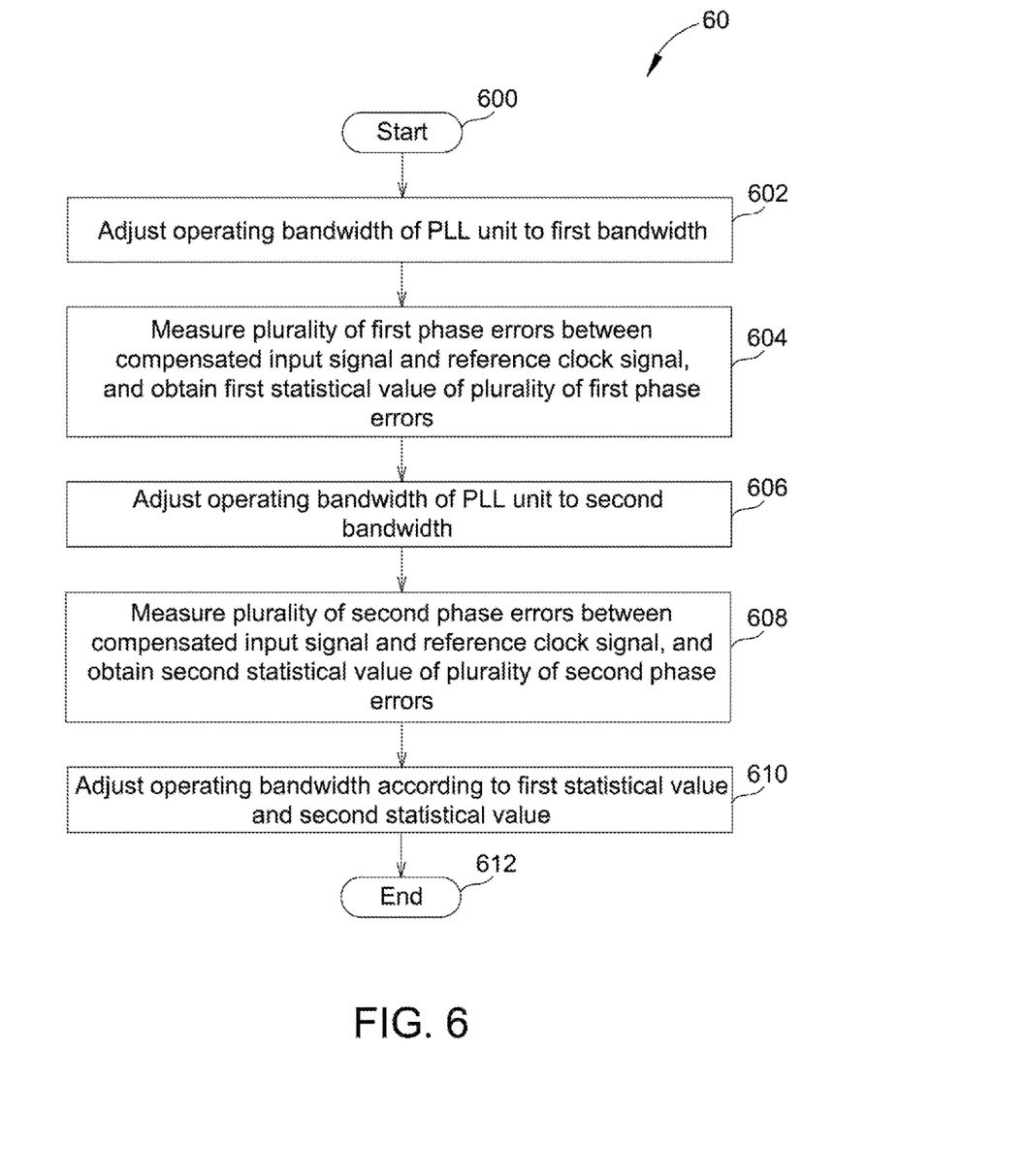
FIG. 6 is a flowchart of a process according to an embodiment of the present invention.

How the loop bandwidth adjusting unit 106 calculates the statistical value of the phase error Φ of the PLL unit 104 operating in different operating frequencies $BW_F$ to optimize the operating bandwidth $BW_F$ of the filter 108 may be concluded to a process 60. As shown in FIG. 6, the process 60 may be applied to a phase recovery module of a wireless communication system to adjust an operating bandwidth of a PLL unit in the phase recovery module. Referring to FIG. 6, the process 60 includes following steps.

In step 600, the process 60 begins.

In step 602, an operating bandwidth of the PLL unit is adjusted to a first operating bandwidth.

In step 604, a plurality of first phase errors between a compensated input signal and a reference clock signal are measured, and a first statistical value of the first phase errors is obtained.

In step 606, the bandwidth of the PLL unit is adjusted to a second operating bandwidth.

In step 608, a plurality of second phase errors between the compensated input signal and the reference clock signal are measured, and a second statistical value of the second phase errors is obtained.

In step 610, the operating bandwidth is adjusted according to the first statistical value and the second statistical value.

In step 612, the process 60 ends.

According to the process 60, the operating bandwidth of the PLL unit is first adjusted to a first bandwidth, which is between an upper bandwidth limit and a lower bandwidth limit and is obtained by interpolating the upper bandwidth limit and the lower bandwidth limit. When the communication system receives an input signal, the PLL unit generates a compensating signal to compensate the phase of the input signal to generate a compensated input signal. According to the phase error between the compensated input signal and a reference clock signal, the PLL unit operating at the first bandwidth adjusts the compensating signal to reduce the phase error between the compensated input signal and the clock reference signal. Meanwhile, the phase error between the compensated input signal and the reference clock signal is recorded as a first phase error, and a first statistical value (e.g., a variance) of a plurality of first phase errors is calculated.

After the first statistical value is obtained, the operating bandwidth of the PLL unit is adjusted to a second bandwidth, which is between an upper bandwidth limit and a lower bandwidth limit and is obtained by interpolating the upper bandwidth limit and the lower bandwidth limit. In this embodiment, the second bandwidth is smaller than the first bandwidth. When the communication system receives the input signal, the PLL unit operating at the second bandwidth adjusts the compensating signal according to the phase error between the compensated input signal and the reference clock signal to reduce the phase error between the compensated input signal and the reference clock signal. At this point, phase error between the compensated input signal and the reference clock signal is recorded as a second phase error, and a second statistical value of a plurality of second phase errors is calculated.

According to a relationship between values of the first statistical value and the second statistical value, the phase recovery module adaptively adjusts the operating bandwidth of the PLL unit. When the first variance is smaller than the second variance, the lower bandwidth limit is replaced by the second operating bandwidth. According to the new lower bandwidth limit and the original upper bandwidth limit, the phase recovery module determines a third bandwidth by interpolation. The phase recovery module then adjusts the operating bandwidth of the PLL unit to the third bandwidth to record a plurality of third phase errors corresponding to the third bandwidth, and obtains a third statistical value corresponding to the third phase errors. After the third statistical value is obtained, the phase recovery module again adjusts the operating bandwidth of the PLL unit according to the relationship between the values of the first statistical value and the third statistical value.

When the second variance is smaller than the first variance, the upper bandwidth limit is replaced by the first bandwidth. According to the new upper bandwidth limit and the original lower bandwidth limit, the phase recovery module determines a fourth bandwidth by interpolation. The phase recovery module then adjusts the operating bandwidth of the PLL unit to the fourth bandwidth to record a plurality of fourth phase errors corresponding to the fourth bandwidth, and obtains a fourth statistical value of the fourth phase errors. After the fourth statistical value is obtained, the phase recovery module again adjusts the operating bandwidth of the PLL unit according to the relationship between the values of the second statistical value and the fourth statistical value. Through the process 60, the operating bandwidth of the PLL unit is optimized to further enhance the performance of the phase recovery module.

By calculating statistical values of phase errors of the PLL unit operating in different operating bandwidths, the phase recovery module according to the embodiment of the present invention adaptively changes the operating bandwidth of the PLL unit according to the time-variant input signal. Thus, the PLL unit is optimized to further enhance the performance of the phase recovery module.

While the invention has been described by way of example and in terms of the embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A loop bandwidth adjusting method, for a phase-locked loop (PLL) unit of a phase recovery module in a wireless communication system, comprising:
adjusting an operating bandwidth of the PLL unit to a first bandwidth;
measuring a plurality of first phase errors between a compensated input signal and a reference clock signal, and obtaining a first statistical value of the plurality of first phase errors, wherein the compensated input signal is generated according to an input signal and a phase compensating signal generated by the PLL unit;
adjusting the operating bandwidth of the PLL unit to a second bandwidth;
measuring a plurality of second phase errors between the compensated input signal and the reference clock signal, and obtaining a second statistical value of the plurality of second phase errors; and
adjusting the operating bandwidth according to the first statistical value and the second statistical value;
wherein, the first bandwidth and the second bandwidth are obtained by interpolating an upper bandwidth limit and a lower bandwidth limit.

2. The loop bandwidth adjusting method according to claim 1, wherein the first bandwidth is greater than the second bandwidth, and the step of adjusting the operating bandwidth according to the first statistical value and the second statistical value comprises:

adjusting the lower bandwidth limit to the second bandwidth when the first statistical value is smaller than the second statistical value;

obtaining a third bandwidth by interpolating the upper bandwidth limit and the adjusted lower bandwidth limit;

adjusting the operating bandwidth of the PLL unit to the third bandwidth;

measuring a plurality of third phase errors between the compensated input signal and the reference clock signal, and obtaining a third statistical value according to the plurality of third phase errors; and adjusting the operating bandwidth according to the first statistical value and the third statistical value.

3. The loop bandwidth adjusting method according to claim 1, wherein the first bandwidth is greater than the second bandwidth, and the step of adjusting the operating bandwidth according to the first statistical value and the second statistical value comprises:

adjusting the upper bandwidth limit to the first bandwidth when the second statistical value is smaller than the first statistical value;

obtaining a third bandwidth by interpolating the adjusted upper bandwidth limit and the lower bandwidth limit;

adjusting the operating bandwidth of the PLL unit to the third bandwidth;

measuring a plurality of third phase errors between the compensated input signal and the reference clock signal, and obtaining a third statistical value of the plurality of third phase errors; and adjusting the operating bandwidth according to the second statistical value and the third statistical value.

4. A loop bandwidth adjusting unit, applied to a phase recovery module in a wireless communication system, comprising:

a statistics circuit, recording a plurality of phase errors between an input signal that is compensated by the phase recovery module and a reference clock signal, and calculating a statistical value of the plurality of phase errors to generate a statistical indication signal;

a control circuit, generating a bandwidth indication signal according to the statistical indication signal; and a converting circuit, generating at least one filter coefficient of an operating bandwidth of a phase-locked loop (PLL) unit in the phase recovery module according to the bandwidth indication signal, wherein the control circuit comprises:

a first adder, calculating a difference between an upper bandwidth limit and a lower bandwidth limit;

a multiplier, calculating a product of the difference and a constant;

a second adder, calculating a sum of the lower bandwidth limit and the product as a first bandwidth;

a third adder, calculating a difference between the upper bandwidth limit and the product as a second bandwidth; and a determining unit, adjusting the upper bandwidth limit, the lower bandwidth limit and the bandwidth indication signal according to the statistical indication signal.

5. The loop bandwidth adjusting unit according to claim 4, wherein when the statistical indication signal indicates that a first statistical value corresponding to the first bandwidth is smaller than a second statistical value corresponding to the second bandwidth, the determining unit adjusts the lower bandwidth limit to the second bandwidth and adjusts the bandwidth indication signal to indicate the first bandwidth.

6. The loop bandwidth adjusting unit according to claim 4, wherein when the statistical indication signal indicates that a first statistical value corresponding to the first bandwidth is greater than a second statistical value corresponding to the second bandwidth, the determining unit adjusts the upper bandwidth limit to the first bandwidth, and adjusts the bandwidth indication signal to indicate the second bandwidth.

7. The loop bandwidth adjusting unit according to claim 4, wherein the converting circuit outputs the bandwidth indication signal as a first filter coefficient of the at least one filter coefficient, and comprises;

an arithmetic unit, calculating a square of a bandwidth indicated by the bandwidth indication signal; and a multiplier, calculating a product of the square and a reciprocal of a square of a damping factor as a second filter coefficient of the at least one filter coefficient.

8. A phase recovery module, applied to a wireless communication system, comprising:

a multiplying unit, multiplying an input signal by a phase compensating signal to generate a compensated input signal;

a phase error detecting unit, detecting a phase difference between the compensated input signal and a reference clock signal;

a phase-locked loop (PLL) unit, generating the phase compensating signal according to the phase difference; and a bandwidth adjusting unit, after adjusting an operating bandwidth of the PLL unit to a first bandwidth, obtaining the phase difference as a plurality of first phase errors, and obtaining a first statistical value of the plurality of first phase errors; after adjusting the operating bandwidth of the PLL unit to a second bandwidth, obtaining the phase difference as a plurality of second phase errors, and obtaining a second statistical value of the plurality of second phase errors; and adjusting the operating bandwidth according to the first statistical value and the second statistical value;

wherein, the first bandwidth and the second bandwidth are obtained by interpolating an upper bandwidth limit and a lower bandwidth limit.

9. The phase recovery module according to claim 8, wherein the first bandwidth is greater than the second bandwidth, and when the first statistical value is smaller than the second statistical value, the bandwidth adjusting unit adjusts the lower bandwidth limit to the second bandwidth, obtains a third bandwidth by interpolating the upper bandwidth limit and the adjusted lower bandwidth limit, adjusts the operating bandwidth of the PLL unit to the third bandwidth, measures a plurality of third phase errors between the compensated input signal and the reference clock signal, obtains a third statistical value of the plurality of third phase errors, and adjusts the operating bandwidth according to the first statistical value and the third statistical value.

10. The phase recovery module according to claim 8, wherein the first bandwidth is greater than the second bandwidth, and when the second statistical value is smaller than the first statistical value, the bandwidth adjusting unit adjusts the upper bandwidth limit to the first bandwidth, obtains a third bandwidth by interpolating the adjusted upper bandwidth limit and the lower bandwidth limit, adjusts the operating bandwidth of the PLL unit to the third bandwidth, measures a plurality of third phase errors between the compensated input signal and the reference clock signal, obtains a third statistical value of the plurality of third phase errors, and adjusts the operating bandwidth according to the second statistical value and the third statistical value.

11. A loop bandwidth adjusting unit, applied to a phase recovery module in a wireless communication system, comprising:

a statistics circuit, recording a plurality of phase errors between an input signal that is compensated by the phase recovery module and a reference clock signal, and calculating a statistical value of the plurality of phase errors to generate a statistical indication signal;

a control circuit, generating a bandwidth indication signal according to the statistical indication signal; and a converting circuit, generating at least one filter coefficient of an operating bandwidth of a phase-locked loop (PLL) unit in the phase recovery module according to the bandwidth indication signal, wherein the statistics circuit comprises:

a divider, dividing a total sum by a threshold number to generate the statistical value of the plurality of phase errors;

an arithmetic unit, calculating a square of the phase error;

an adder, calculating a sum of the square of the phase error and an intermediate total sum; and a counter, counting the number of times of receiving the sum of the square of the phase error and the intermediate total sum, outputting the sum of the square of the phase error and the intermediate total sum as the intermediate total sum to the adder when the number of times of receiving the sum is smaller than the threshold number; and using the sum of the square of the phase error and the intermediate sum as the total sum when the number of times of receiving the sum is equal to the threshold number.

* * * * *